(12) United States Patent
Shibata et al.

(10) Patent No.: US 10,253,432 B2
(45) Date of Patent: Apr. 9, 2019

(54) SEMICONDUCTOR SUBSTRATE MANUFACTURING METHOD

(71) Applicant: SUMITOMO CHEMICAL COMPANY, LIMITED, Tokyo (JP)

(72) Inventors: Masatomo Shibata, Hitachi (JP); Takehiro Yoshida, Hitachi (JP); Toshio Kitamura, Hitachi (JP); Yukio Abe, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 197 days.

(21) Appl. No.: 15/114,364

(22) PCT Filed: Jan. 28, 2014

(86) PCT No.: PCT/JP2014/051806

§ 371 (c)(1),
(2) Date: Jul. 26, 2016

(87) PCT Pub. No.: WO2015/114732

PCT Pub. Date: Aug. 6, 2015

(65) Prior Publication Data

US 2017/0009378 A1    Jan. 12, 2017

(51) Int. Cl.
*H01L 21/00* (2006.01)
*C30B 33/00* (2006.01)
(Continued)

(52) U.S. Cl.
CPC .............. *C30B 33/00* (2013.01); *B28D 5/021* (2013.01); *B28D 5/047* (2013.01); *C30B 23/00* (2013.01);
(Continued)

(58) Field of Classification Search
CPC ... H01L 21/0254; H01L 33/32; H01L 29/045; H01L 29/2003
See application file for complete search history.

(56) References Cited

U.S. PATENT DOCUMENTS 6,413,627 B1   7/2002   Motoki et al.
6,447,604 B1   9/2002   Flynn et al.
(Continued)

FOREIGN PATENT DOCUMENTS

JP   H01-122999 A   5/1989
JP   2000-012900 A   1/2000
(Continued)

OTHER PUBLICATIONS

International Search Report (ISR) (PCT Form PCT/ISA/210), in PCT/JP2014/051806, dated Mar. 18, 2014.
(Continued)

*Primary Examiner* — Nicholas J Tobergte
(74) *Attorney, Agent, or Firm* — McGinn IP Law Group, PLLC

(57) ABSTRACT

A semiconductor substrate manufacturing method includes: epitaxially growing a columnar III nitride semiconductor single crystal on a principal place of a circular substrate; removing a hollow cylindrical region at an outer peripheral edge side of the III nitride semiconductor single crystal to leave a solid columnar region at an inside of the hollow cylindrical region of the III nitride semiconductor single crystal; and slicing the solid columnar region after removing the hollow cylindrical region. The hollow cylindrical region is removed such that the shape of the III nitride semiconductor single crystal is always keeps an axial symmetry that a center axis of the III nitride semiconductor single crystal is defined as a symmetric axis.

24 Claims, 10 Drawing Sheets

(51) Int. Cl.

| | | |
|---|---|---|
| *C30B 23/00* | (2006.01) | |
| *C30B 29/40* | (2006.01) | |
| *C30B 33/06* | (2006.01) | |
| *B28D 5/02* | (2006.01) | |
| *B28D 5/04* | (2006.01) | |
| *C30B 25/02* | (2006.01) | |
| *C30B 29/60* | (2006.01) | |
| *H01L 29/04* | (2006.01) | |
| *H01L 29/20* | (2006.01) | |

(52) U.S. Cl.
CPC ............ *C30B 25/02* (2013.01); *C30B 29/403* (2013.01); *C30B 29/406* (2013.01); *C30B 29/605* (2013.01); *C30B 33/06* (2013.01); *H01L 29/045* (2013.01); *H01L 29/2003* (2013.01)

(56) References Cited

U.S. PATENT DOCUMENTS

| | | | |
|---|---|---|---|
| 6,596,079 B1 | 7/2003 | Vaudo et al. | |
| 6,693,021 B1 | 2/2004 | Motoki et al. | |
| 7,242,075 B2* | 7/2007 | Mun | H01L 21/3225 257/611 |
| 7,589,000 B2 | 9/2009 | Kasai et al. | |
| 7,723,142 B2 | 5/2010 | Matsumoto et al. | |
| 7,858,502 B2 | 12/2010 | Kasai et al. | |
| 8,404,569 B2 | 3/2013 | Kasai et al. | |
| 8,574,364 B2 | 11/2013 | Fujiwara et al. | |
| 9,010,193 B2* | 4/2015 | Walther | G01C 19/5712 73/774 |
| 9,144,842 B2* | 9/2015 | Feng | B22D 27/045 |
| 9,175,417 B2* | 11/2015 | Fujikura | C30B 25/00 |
| 2003/0157376 A1 | 8/2003 | Vaudo et al. | |
| 2004/0072410 A1 | 4/2004 | Motoki et al. | |
| 2004/0089222 A1 | 5/2004 | Motoki et al. | |
| 2005/0054124 A1* | 3/2005 | Mun | H01L 21/3225 438/12 |
| 2007/0105351 A1 | 5/2007 | Motoki et al. | |
| 2007/0148920 A1 | 6/2007 | Kasai et al. | |
| 2008/0118733 A1 | 5/2008 | Oshima | |
| 2008/0296585 A1 | 12/2008 | Matsumoto et al. | |
| 2009/0263955 A1 | 10/2009 | Motoki et al. | |
| 2010/0009526 A1 | 1/2010 | Kasai et al. | |
| 2011/0065265 A1 | 3/2011 | Kasai et al. | |
| 2011/0163323 A1 | 7/2011 | Motoki et al. | |
| 2011/0163326 A1 | 7/2011 | Matsumoto | |
| 2012/0034149 A1 | 2/2012 | Fujiwara et al. | |
| 2012/0319129 A1 | 12/2012 | Matsumoto | |
| 2013/0072005 A1 | 3/2013 | Fujikura | |
| 2013/0244406 A1 | 9/2013 | Kasai et al. | |

FOREIGN PATENT DOCUMENTS

| | | |
|---|---|---|
| JP | 2006-096588 A | 4/2006 |
| JP | 2006-097058 A | 4/2006 |
| JP | 2006-273716 A | 10/2006 |
| JP | 2007-197302 A | 8/2007 |
| JP | 2008-127252 A | 6/2008 |
| JP | 2008-297175 A | 12/2008 |
| JP | 2009-161430 A | 7/2009 |
| JP | 2009-298659 A | 12/2009 |
| JP | 2012-017259 A | 1/2012 |
| JP | 2013-032278 A | 2/2013 |
| JP | 2013-051388 A | 3/2013 |
| JP | 2013-060349 A | 4/2013 |
| JP | 2013-230971 A | 11/2013 |

OTHER PUBLICATIONS

Japanese Office Action dated Aug. 8, 2017 in Japanese Application No. 2015-559639 with an English translation thereof.

Japanese Office Action dated Feb. 7, 2017 with an English translation thereof.

English Translation of the International Preliminary Report on Patentability in PCT Application No. PCT/JP2014/051806 dated Aug. 11, 2016.

Extended European Search Report dated Sep. 1, 2017 in European Application No. 14881035.1.

Japanese Office Action, dated Nov. 20, 2018, in Japanese Application No. 2017-215775 and English Translation thereof.

* cited by examiner

SEMICONDUCTOR SUBSTRATE MANUFACTURING METHOD

TECHNICAL FIELD

The present invention relates to a method for manufacturing a semiconductor substrate.

BACKGROUND ART

A method of slicing a semiconductor substrate from a semiconductor crystal that is epitaxially grown thick on a seed crystal substrate by a method such as HVPE (hydride vapor phase epitaxy) is known as one of a method for manufacturing a group III nitride semiconductor single crystal substrate representing a conventional GaN (gallium nitride) substrate. Such a method partly begins to be practically used.

However, in the method, when beginning to slice the crystal grown on the seed crystal substrate, a problem frequently arises that a crack occurs in the crystal or the crystal is broken. The crack tends to occur according as a dislocation density in the crystal or a defect density such as a polarity reversed region lowers, or according as a crystal property becomes uniform, or according as a diameter of the crystal increases. Thus, it is difficult to slice a superior large crystal (e.g. the diameter is more than 50 mm) without the crack.

To solve the problem, a technique is known in which the crystal is cylindrically ground using a grinding stone before the slicing (see e.g., PTL1). PTL1 states that the crack in the crystal during slicing can be prevented by slicing the crystal after removing an outer peripheral edge having a stain in the crystal.

PRIOR ART DOCUMENT

Patent Literature

PTL1: JP-A-2013-60349

SUMMARY OF INVENTION

Technical Problem

However, even when using the technique disclosed in PTL 1, the cylindrical grinding may often cause the crack in the crystal as soon as it is begun for removing the outer peripheral edge.

It is an object of the invention to provide a method for manufacturing a semiconductor substrate that allows the manufacture of a semiconductor substrate by slicing the epitaxial grown group III nitride semiconductor single crystal while preventing the occurrence of the crack.

Solution to Problem

To achieve the object as described above, an embodiment of the invention provides a method for manufacturing semiconductor substrate set forth in [1] to [24] below.

[1] A method for manufacturing a semiconductor substrate, comprising:
  epitaxially growing a columnar group III nitride semiconductor single crystal on a principal plane of a circular substrate;
  removing a hollow cylindrical region at an outer peripheral edge side of the group III nitride semiconductor single crystal to leave a solid columnar region at an inside of the hollow cylindrical region of the group III nitride semiconductor single crystal; and
  slicing the solid columnar region after removing the hollow cylindrical region,
  wherein the removing of the hollow cylindrical region is carried out such that a shape of the group III nitride semiconductor single crystal always keeps an axial symmetry that a central axis of the semiconductor crystal is defined as a symmetry axis.

[2] The method according to [1] wherein the hollow cylindrical region comprises a region that has a concentration of an impurity that is different from that in the solid columnar region

[3] The method according to [1] or [2], wherein the hollow cylindrical region comprises a region formed by a crystal growth using a plane that has a different orientation from an orientation in an upper surface of the solid columnar region as a growth interface in the epitaxial growth of the group III nitride semiconductor single crystal.

[4] The method according to [1] or [2], wherein the hollow cylindrical region comprises a facet plane having a plane orientation different from that in the upper surface of the hollow cylindrical region.

[5] The method according to [1] or [2], wherein the removing of the hollow cylindrical region is carried out such that a shape of the removed region is always kept into a hollow cylindrical shape with a uniform height.

[6] The method according to [1] or [2], wherein the removing of the hollow cylindrical region is carried out by grinding using a grindstone, ultrasonic processing, electric discharge processing, etching, or laser processing.

[7] The method according to [1] or [2], wherein the group III nitride semiconductor single crystal is a gallium nitride crystal.

[8] The method according to [1] or [2], wherein an upper surface of the solid columnar region is a c-plane of the group III nitride semiconductor single crystal.

[9] The method according to [2] wherein the group III nitride semiconductor single crystal is a gallium nitride crystal epitaxially grown by HVPE method, and the impurity is oxygen.

[10] The method according to [1] or [2], wherein the removing of the hollow cylindrical region is carried out such that a region of the substrate just below the hollow cylindrical region is not removed.

[11] The method according to claim [10], wherein the principal plane of the substrate is ground after slicing the solid columnar region such that the substrate is reused as a seed crystal.

[12] A method for manufacturing a semiconductor substrate, comprising:
  epitaxially growing a columnar group III nitride semiconductor single crystal on a principal plane of a circular substrate;
  forming a cylindrical cavity in the group III nitride semiconductor single crystal to separate the group III nitride semiconductor single crystal into a hollow cylindrical region at an outer peripheral edge side of the group III nitride semiconductor single crystal and a solid columnar region at an inside of the hollow cylindrical region of the group III nitride semiconductor single crystal; and
  slicing the solid columnar region after separating the group III nitride semiconductor single crystal into the hollow cylindrical region and the solid columnar region, wherein the forming of the cavity is carried out such that a shape of the group III nitride semiconductor single crystal always keeps an axial symmetry that a central axis of the semiconductor crystal is defined as a symmetry axis.

[13] The method according to [12], wherein the hollow cylindrical region comprises a region that has a concentration of an impurity that is different from that in the solid columnar region.

[14] The method according to [12] or [13], wherein the hollow cylindrical region comprises a region formed by a crystal growth using a plane that has a different orientation from an orientation in an upper surface of the solid columnar region as a growth interface in the epitaxial growth of the group III nitride semiconductor single crystal.

[15] The method according to [12] or [13], wherein the hollow cylindrical region comprises a facet plane having a plane orientation different from that in the upper surface of the hollow cylindrical region.

[16] The method according to [12] or [13], wherein the removing of the hollow cylindrical region is carried out such that a shape of the removed region is always kept into a hollow cylindrical shape with a uniform height.

[17] The method according to [12] or [13], wherein the removing of the hollow cylindrical region is carried out by drilling using a hole saw, grinding using a grindstone, ultrasonic processing, electric discharge processing, or laser processing.

[18] The method according to [12] or [13], wherein the group III nitride semiconductor single crystal is a gallium nitride crystal.

[19] The method according to [12] or [13], wherein an upper surface of the solid columnar region is a c-plane of the group III nitride semiconductor single crystal.

[20] The method according to [13], wherein the group III nitride semiconductor single crystal is a gallium nitride crystal epitaxially grown by HVPE method, and the impurity is oxygen

[21] The method according to [12] or [13], wherein the hollow cylindrical region is removed before slicing the solid columnar region.

[22] The method according to [12] or [13], wherein the solid columnar region is sliced along with the hollow cylindrical region while the hollow cylindrical region remains around the solid columnar region.

[23] The method according to [12] or [13], wherein the forming the cavity is carried out such that a region of the substrate just below the hollow cylindrical region is not removed.

[24] The method according to [23], wherein the principal plane of the substrate is ground after slicing the solid columnar region such that the substrate is reused as a seed crystal.

Advantageous Effects of Invention

According to the invention, a method for manufacturing a semiconductor substrate can be provided that allows the manufacture of the semiconductor substrate by slicing the epitaxial grown group III nitride semiconductor single crystal while preventing growing the crack.

DESCRIPTION OF EMBODIMENT

[First Embodiment]

It is conventionally known that a strain occurs in a hollow cylindrical region at an outer peripheral edge side of a columnar crystal epitaxial grown, and that when slicing the crystal, a crack is caused by the strain. The strain is caused by a difference in the concentration of an impurity which is incorporated in the crystal in the epitaxial growing between the abovementioned hollow cylindrical region and the inner region thereof.

As a result of researching a mechanism for causing the crack earnestly, inventors have found that an immediate cause is the unbalancing of strain distribution in the crystal caused by releasing locally the strain in the hollow cylindrical region that is distributed in axial symmetry in the slicing step, and that the occurrence of the crack can be prevented by conducting the slicing step so as to keep the symmetry of the strain distribution.

The present embodiment is intended to remove the strain in the crystal before conducting the slicing step on the basis of the findings mentioned above, wherein the hollow cylindrical region described above is removed from the crystal while keeping the balance of the strain distribution and the slicing step is subsequently conducted. The details thereof will be described below.

(Growth of a Group III Nitride Semiconductor Single Crystal)

Figure 1A:
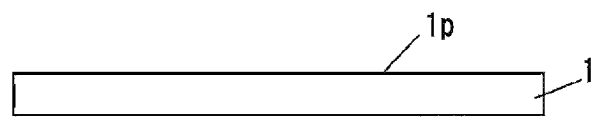
FIG. 1A is a vertical cross sectional view showing schematically a step for epitaxially growing a columnar group III nitride semiconductor single crystal on a substrate.
Figure 1B:
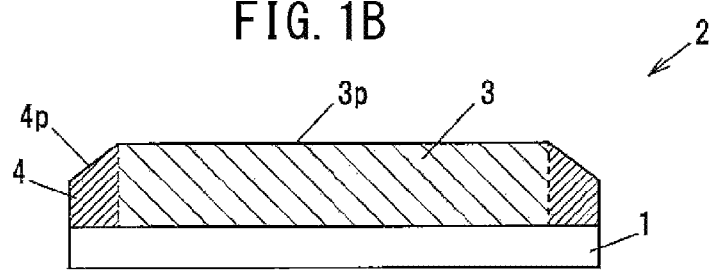
FIG. 1B is a vertical cross sectional view showing schematically a step for epitaxially growing a columnar group III nitride semiconductor single crystal on a substrate.
Figure 1C:
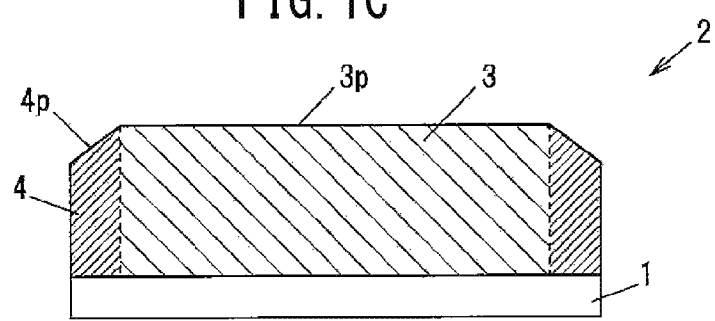
FIG. 1C is a vertical cross sectional view showing schematically a step for epitaxially growing a columnar group III nitride semiconductor single crystal on a substrate.
Figure 2:
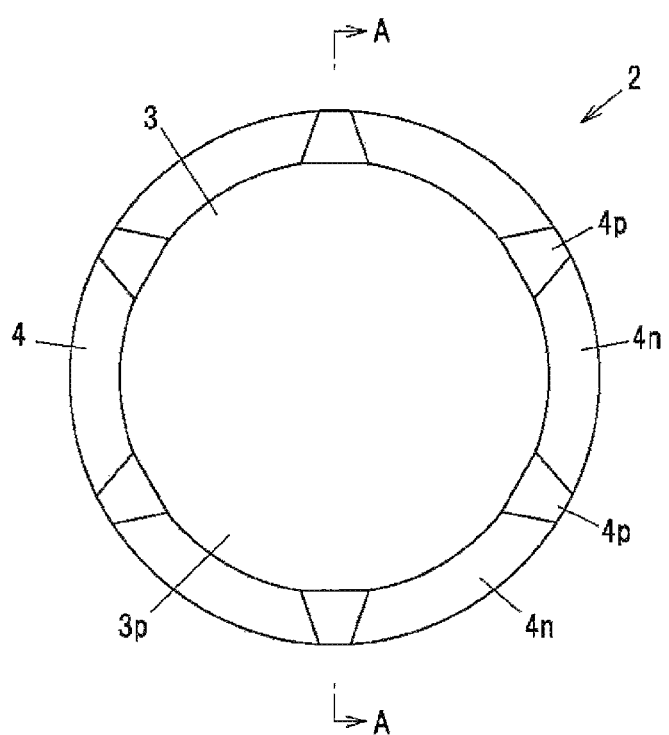
FIG. 2 is a top view showing a group III nitride semiconductor single crystal epitaxially grown on a c-plane substrate.

FIGS. 1A, 1B, and 1C are vertical cross sectional views showing schematically steps for epitaxially growing a columnar group III nitride semiconductor single crystal 2 on a substrate 1. FIG. 2 is a top view showing the group III nitride semiconductor single crystal 2 epitaxially grown. The group III nitride semiconductor single crystal 2 shown in FIGS. 1A, 1B, 1C and FIG. 2 is a GaN crystal grown in a c-plane (Ga plane) as an example of the group III nitride semiconductor single crystal 2.

First, as shown in FIG. 1A, a circular substrate 1 for a seed crystal is provided. The substrate 1 is, for example, a GaN (gallium nitride) substrate whose principal plane 1$p$ is a c-plane. The GaN substrate is suitable for the seed crystal to grow the GaN crystal epitaxially.

Then, as shown in FIGS. 1B and 1C, the group III nitride semiconductor single crystal 2 grows epitaxially on the principal plane 1$p$ of the substrate 1. The group III nitride semiconductor single crystal 2 grows so as to form columnar in perpendicular to the principal plane 1$p$ of the substrate 1. In this epitaxial growth, a growth interface at the outer peripheral edge side of the group III nitride semiconductor single crystal 2 includes a facet plane 4$p$. Further, a crystal growth that the growth interface is a specific crystal plane is called facet growth, and the specific crystal plane is called a facet plane.

Herein, at a process described after, in the outer peripheral edge side of the group III nitride semiconductor single crystal 2, a hollow cylindrical region removed from the group III nitride semiconductor single crystal 2 defines a hollow cylindrical region 4. A central axis of the hollow cylindrical region 4 is similar to a central axis of the group III nitride semiconductor single crystal 2, and an inner diameter of the hollow cylindrical region 4 is even. And a solid columnar region arranged at inside of the hollow cylindrical region 4 defines a solid columnar region 3. The hollow cylindrical region 4 can set a hollow cylindrical region whose upper surface includes the facet plane 4$p$.

Plane directions of a plane 3$p$ that is the upper surface of the solid columnar region 3 and the facet plane 4$p$ are different. For instance, as the substrate 1 is a GaN substrate whose principal plane 1$p$ is the c-plane and the group III nitride semiconductor single crystal 2 is the GaN crystal, the plane 3$p$ of the solid columnar region 3 represents the c-plane. Also, planes 4$n$ excepting the facet plane 4$p$ at the upper surface of the hollow cylindrical region 4 are configured by planes having different orientations from the plane 3$p$ of the solid columnar region 3.

The growth of the group III nitride semiconductor single crystal 2 is progressed while keeping mostly the shape and size of the facet plane 4$p$ and the plane 4$n$.

As previously described, the concentration of impurities which is incorporated into a predetermined region of the crystal in epitaxial growth depends on an orientation of the growth interface of the region in epitaxial growth. Thus, a region formed by the crystal growth whose growth interfaces are the facet plane 4$p$ and the plane 4$n$ is different in the concentration of the impurities incorporated in the epitaxial growth of the group III nitride semiconductor single crystal 2 from a region formed by the crystal growth whose growth interface is the plane 3$p$.

The hollow cylindrical region 4 includes entire or substantially entire of the region formed by the crystal growth whose growth interfaces are the facet plane 4$p$ and the plane 4$n$, and the solid columnar region 3 corresponds or substantially corresponds to the region formed by the crystal growth whose growth interface is the plane 3$p$. Accordingly, the impurity concentrations of the hollow cylindrical region 4 and the solid columnar region 3 are different.

It is preferable to use the HVPE (hydride vapor phase epitaxy) method which can increase growth speed as a method to grow the group III nitride semiconductor single crystal 2. In using the HVPE method, the impurity incorporated into the group III nitride semiconductor single crystal 2 during the epitaxial growth and caused of the strain is often oxygen caused by a quartz member for using a furnace body.

Furthermore, the substrate 1 and the group III nitride semiconductor single crystal 2 may be made of same kind crystal (i.e. a GaN substrate and a GaN crystal), may be made of different kind crystal (i.e. a sapphire substrate and a GaN crystal). As the group III nitride semiconductor single crystal 2 grows homoepitaxially on the substrate 1 which is made of same kind crystal with the group III nitride semiconductor single crystal 2, for instance, it is preferable to use high uniformity and low-dislocation density substrate made by the VAS (void-assisted separation) method such as disclosed in Japanese patent No. 3631724 as the substrate 1. As the group III nitride semiconductor single crystal 2 is heteroepitaxially grown on the substrate 1 which is made of different kind crystal from the group III nitride semiconductor single crystal 2, as thickness of the group III nitride semiconductor single crystal 2 increases, the group III nitride semiconductor single crystal 2 is easy to produce the crack. However, the crack can be suppressed by growing the crystal with intervening something of a strain relaxation layer in the hetero interface. For example, applying the technology shown in Japanese patent No. 3886341, it can decrease a dislocation density and suppress the crack caused by growth of thick film.

The distribution of the impurity concentration in the group III nitride semiconductor single crystal 2 can be confirmed easily as a contrast by observing emission of the group III nitride semiconductor single crystal 2 irradiated with excitation light such as ultraviolet light. Furthermore, the strain in the group III nitride semiconductor single crystal 2 can be detected by photo elasticity measurement or Raman measurement.

The region formed by the crystal growth whose growth interface are the facet plane 4$p$ and the plane 4$n$, thus the region having different impurity concentration in the region formed by the crystal growth whose growth interface is the plane 3$p$ is often almost similar to a region where the strain arises, however the region where the strain arises is sometimes distributed larger than the region having different impurity concentration in the region formed by the crystal growth whose growth interface is the plane 3$p$. In this case, it is preferable to remove the entire region where the strain arises, as obtaining strain field needs to a dedicated equipment, there are problems that a manufacturing process and a manufacturing cost increase.

As long as the method to remove the hollow cylindrical region 4 that is set as a hollow cylindrical region in which the upper surface includes the facet plane 4p that can observe visually, even not available to remove the entire region having the strain, the strain can be removed even preventing forming the crack by slicing. Thus it can be suppressed to form the crack with short time and low costs.

Furthermore, even a hollow cylindrical region whose value is smallest, which satisfies "a hollow cylindrical region whose upper surface includes the facet plane 4p in the group III nitride semiconductor single crystal 2" is set as the hollow cylindrical region 4, the hollow cylindrical region 4 includes all or almost all region having the strain. Thus, even in this case, all or almost all region having the strain can be removed by removing the hollow cylindrical region 4 from the group III nitride semiconductor single crystal 2.

Also, as the thickness of the hollow cylindrical region 4 increases and the hollow cylindrical region 4 includes by a region whose orientation at the upper surface is equal to the plane 3p in the solid columnar region 3, the region having the strain can be removed certainly. However, according as the thickness of the hollow cylindrical region 4 increases, the diameter of the solid columnar region 3 decreases and, therefore, a diameter of the semiconductor substrate obtained from the solid columnar region 3 decreases.

As shown in FIG. 2, as the group III nitride semiconductor single crystal 2 is a GaN crystal whose plane 3p is the c-plane, the facet plane 4p is a (1-10X) plane (X is natural number), and appears at six-fold symmetrical position whose axis is the central axis of the group III nitride semiconductor single crystal 2 in the outer peripheral edge side of the upper surface of the group III nitride semiconductor single crystal 2. Further, cross sections shown in FIG. 1B and FIG. 1C are suitable for a cross section which cut the substrate 1 and the group III nitride semiconductor single crystal 2 along with the A-A line.

The c-plane of the GaN crystal is the densest plane, and a region which the c-plane becomes the growth interface is characterized substantially poor incorporation of impurities such as oxygen compared with a region whose growth interface has the other orientation.

Also, as the HVPE method use generally a furnace member made of a quartz member with heating more than 1000° C., silicon and oxygen which are produced by resolving the quartz are easy to incorporate in the group III nitride semiconductor single crystal 2 as impurity. Here, as the silicon has low dependency for the orientation of the growth interface in the group III nitride semiconductor single crystal 2 and uniformly incorporates as a whole, the silicon is often applied for a dopant to control an electric conductivity of the GaN crystal. Thus the distribution of the strain in the group III nitride semiconductor single crystal 2 caused by the silicon is not non-uniform, the background concentration in the silicon crystal as the impurity seldom occurs.

In the GaN crystal which is grown in c-plane using the HVPE method, depending on the growth condition, commonly, incorporates oxygen about $10^{16}$ to $10^{17}$ $cm^{-3}$. However, in the region growing by the other growth interface excepting c-plane (the facet plane 4p and the plane 4n), incorporated is oxygen that the oxygen concentration is about $10^{18}$ to $10^{19}$ $cm^{-3}$, which is ten to hundred as much as oxygen incorporated in the GaN crystal whose growth interface is the c-plane. As a result, the one GaN crystal has low oxygen concentration region and high oxygen concentration region and strain filed appears in the outer peripheral edge side of the crystal.

(Removal of the Hollow Cylindrical Region)

As described above, the strain in the group III nitride semiconductor single crystal 2 is caused by the distribution of the impurity concentration, the strain is distributed cylindrically in the outer peripheral edge side of the group III nitride semiconductor single crystal 2, and it is balanced totally. However, in order to process the group III nitride semiconductor single crystal 2 including the strain, when cutting or removing a part of the outer periphery of the group III nitride semiconductor single crystal 2, a part of the strain is released locally and a balance of the strain in the group III nitride semiconductor single crystal may be unbalanced and may form the crack.

Due to this, the removal of the hollow cylindrical region 4 is needed to be carried out such that a shape of the group III nitride semiconductor single crystal 2 always keeps an axial symmetry that a central axis of the semiconductor crystal is defined as a symmetrical axis so as not to break the balance of the strain in the group III nitride semiconductor single crystal 2 in removing the hollow cylindrical region 4 from the group III nitride semiconductor single crystal 2. Herein, the axial symmetry is the same meaning of the rotational symmetry in n th symmetry (n is an arbitrary integer). In this case, removing the hollow cylindrical region 4 is progressed in the direction linear to the growth direction of the group III nitride semiconductor single crystal (the vertical direction of the principal plane 1p of the substrate 1).

For example, in case of removing the hollow cylindrical region 4 by grinding using a hollow cylindrical grindstone described below, ultrasonic processing using a hollow cylindrical ultrasonic processing tool, electric discharge processing using a hollow cylindrical sinker electric discharge electrode, or laser processing, removing the hollow cylindrical region 4 is applied such that a shape of the removed region is always kept into a hollow cylindrical shape with a uniform height.

A specific example of the method of removing the hollow cylindrical region will be described below.

Figure 3A:
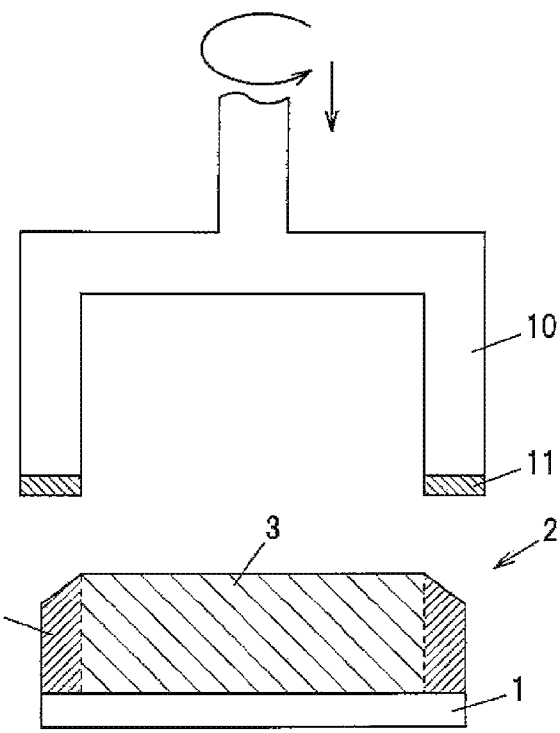
FIG. 3A is a vertical cross sectional view showing schematically a step for removing a hollow cylindrical region by grinding using a hollow cylindrical grindstone.
Figure 3B:
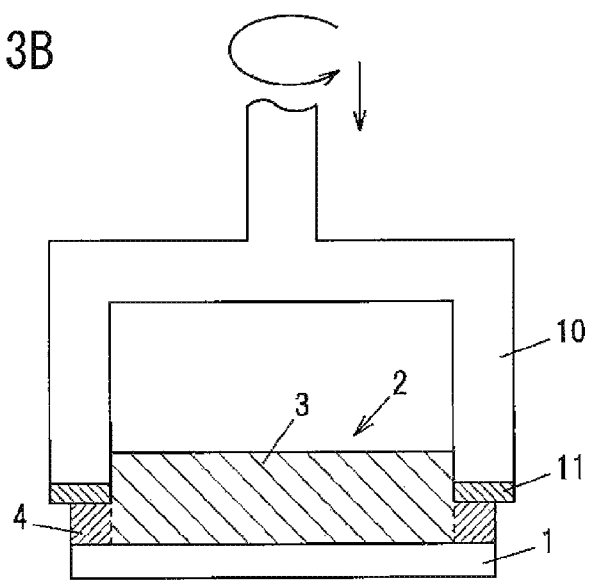
FIG. 3B is a vertical cross sectional view showing schematically a step for removing a hollow cylindrical region by grinding using a hollow cylindrical grindstone.

FIGS. 3A and 3B are vertical cross sectional views showing schematically the step for removing the hollow cylindrical region 4 by grinding using a hollow cylindrical grind stone 10.

The hollow cylindrical grindstone 10 has an abrasive grain forming part 11 on an edge (bottom) of the grindstone 10. The hollow cylindrical region 4 is removed slowly by contacting the grindstone 10 to the group III nitride semiconductor single crystal 2 from an upper side with rotating the abrasive grain with adjusting a rotational axis with the central axis of the group III nitride semiconductor single crystal 2. According to this method, the hollow cylindrical region 4 can be removed such that the shape of the removed region is always kept into the hollow cylindrical shape with uniform height. Moreover, a loose abrasive mixed in liquid can be used as the abrasive grain.

Figure 4A:
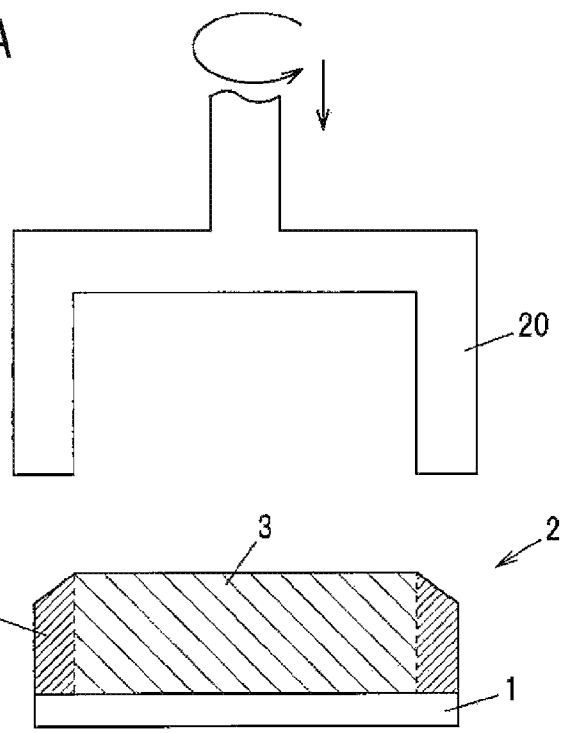
FIG. 4A is a vertical cross sectional view showing schematically a step for removing a hollow cylindrical region by electric discharging using a hollow cylindrical sinker electric discharge electrode.
Figure 4B:
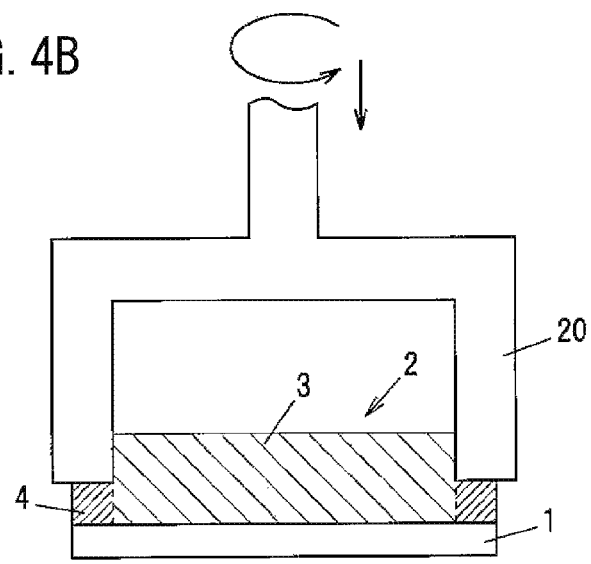
FIG. 4B is a vertical cross sectional view showing schematically a step for removing a hollow cylindrical region by electric discharging using a hollow cylindrical sinker electric discharge electrode.

FIGS. 4A and 4B are the vertical cross sectional view showing schematically the step for removing a hollow cylindrical region 4 by electric discharge processing using a hollow cylindrical sinker electric discharge electrode 20.

The hollow cylindrical region 4 is removed slowly by rotating the hollow cylindrical sinker electric discharge electrode 20 with adjusting its rotational axis with the central axis of the group III nitride semiconductor single crystal 2, electric discharge processing between the sinker electric discharge electrode 20 and the group III nitride semiconductor single crystal 2, and contacting the sinker electric discharge electrode to the group III nitride semiconductor single crystal 2 from upper side. According to this method, the hollow cylindrical region 4 can be removed such that the shape of the removed region is always kept into the hollow cylindrical shape with inform height.

Apart from that, the hollow cylindrical region 4 can be removed such that the shape of the removed region is always kept into the hollow cylindrical shape with uniform height using a cylindrical ultrasonic processing tool, or laser processing.

FIGS. 3A, 3B, 4A, and 4B show an example of removing the hollow cylindrical region 4 from the upper side of the group III nitride semiconductor single crystal 2, the hollow cylindrical region 4 may be removed from the side of the substrate 1. However, in this case, as a region of the substrate 1 just below the hollow cylindrical region 4 is also removed, the hollow cylindrical region 4 is needed to be removed from the side of the group III nitride semiconductor single crystal 2 for reusing the substrate 1 as the seed crystal.

Figure 5:
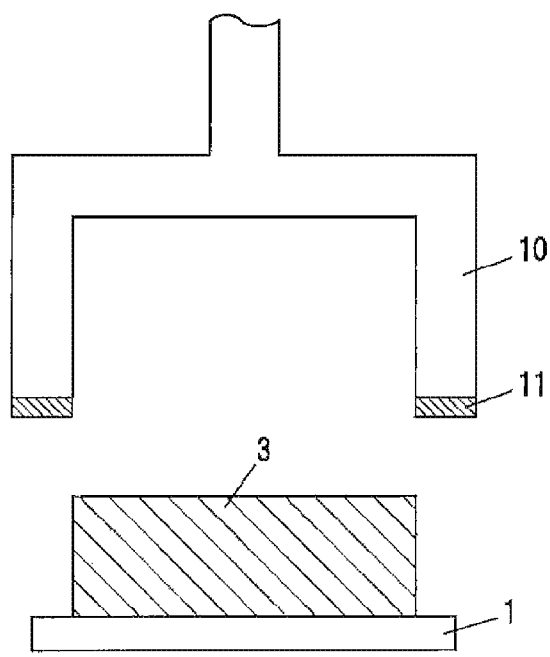
FIG. 5 is a vertical cross sectional view showing a situation that a hollow cylindrical region is removed from the side of a grown group III nitride semiconductor single crystal and a substrate region is left just below the hollow cylindrical region.

FIG. 5 is a vertical cross sectional view showing a situation that a hollow cylindrical region 4 is removed from the side of a grown group III nitride semiconductor single crystal 2 and a region on the substrate 1 just below the hollow cylindrical region 4 is left. This substrate 1 can be reused as the seed crystal with forming semiconductor substrates by slicing the solid columnar region 3 of the remaining group III nitride semiconductor single crystal 2 and then grinding the principal plane 1p.

Figure 6:
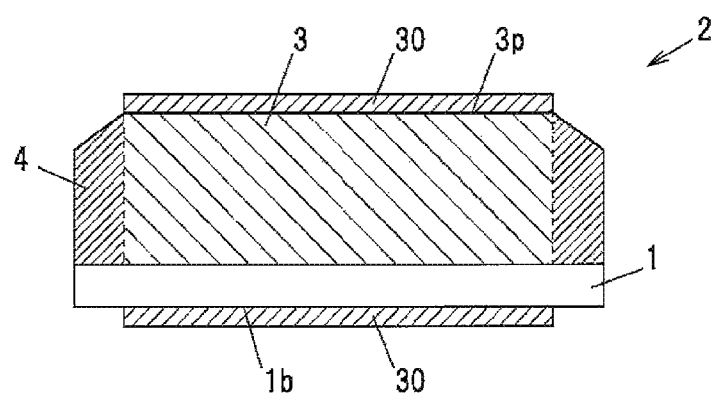
FIG. 6 is a vertical cross sectional view showing a substrate on which a protective coat for removing a hollow cylindrical region selectively by etching is formed and a group III nitride semiconductor single crystal.

FIG. 6 is a vertical cross sectional view showing a substrate 1 on which a protective coat 30 for removing the hollow cylindrical region 4 selectively by etching is formed and a group III nitride semiconductor single crystal 2.

First, a protective film 30 made of SiO$_2$ etc. covers on the plane 3p of the solid columnar region 3 where does not intend to remove, and a region corresponding to the solid columnar region 3 on the opposite surface 1b to the group III nitride semiconductor single crystal 2. Then the hollow cylindrical region 4 is removed by gas phase etching or wet etching. As the gas phase etching, for example, reactive ion etching using BCl (boron trichloride) gas can be applied. Also as the wet etching, an etching can be used which uses hot phosphoric acid sulfuric acid etchant. By controlling properly condition of the etching, the hollow cylindrical region 4 can be removed such that the shape of the removed region is always kept into the hollow cylindrical shape with uniform height.

(Slicing of the Solid Columnar Region)

Next, the solid columnar region 3 remaining by the removing of the hollow cylindrical region 4 is sliced.

Figure 7A:
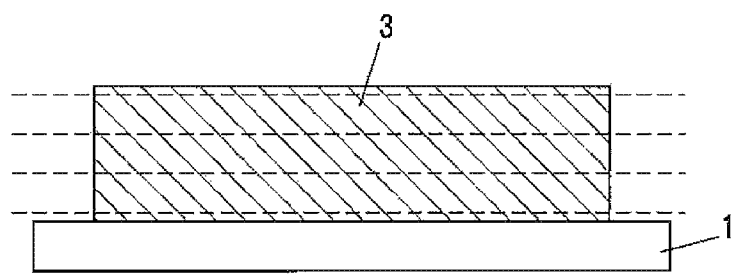
FIG. 7A is a vertical cross sectional view showing schematically a step for slicing a solid columnar region.
Figure 7B:
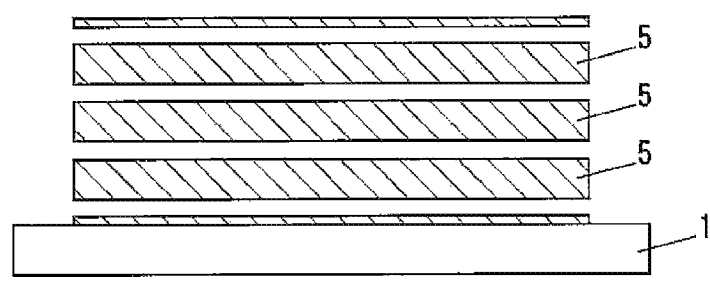
FIG. 7B is a vertical cross sectional view showing schematically a step for slicing a solid columnar region.

FIGS. 7A and 7B are vertical cross sectional views showing schematically the step for slicing the solid columnar region 3. Herein, the dot-line shows the point of slicing the solid columnar region 3. Existing slicing technologies such as an inner peripheral blade slicer, an outer peripheral blade slicer, wire saw, or electric discharge machine can be used for slicing the solid columnar region 3.

After slicing the solid columnar region 3, the obtained circular semiconductor substrate 5 is beveled along an outer peripheral edge of the circular semiconductor substrate 5, and the front and rear surfaces of the circular semiconductor substrate 5 are ground.

As is clear from the manufacturing process of the semiconductor substrate 5 described above, the diameter of the semiconductor substrate 5 is smaller than the diameter of the substrate 1. Thus it is preferable to determine the diameter of the substrate 1 while considering the diameter of the semiconductor substrate 5 needed and the size of the hollow cylindrical region 4 to remove. Moreover, the diameter of the group III nitride semiconductor single crystal 2 may be reduced by a size smaller than the diameter of the substrate 1 so as to prevent the adhesion of the group III nitride semiconductor single crystal 2 and a growth jig.

[Second Embodiment]

The second embodiment is different from the first embodiment in a means for removing the strain in the group III nitride semiconductor single crystal. Meanwhile, the explanation of the same as in the first embodiment is omitted or simplified below.

(Separating of the Hollow Cylindrical Region)

In the present embodiment, the hollow cylindrical region 4 is a region which is separated from the solid columnar region 3 before slicing the solid columnar region 3. By separating the hollow cylindrical region 4 from the solid columnar region 3, as in the case of removing the hollow cylindrical region 4, it is possible to prevent the occurrence of the crack during the slicing of the solid columnar region 3.

The separating of the solid columnar region 3 and the hollow cylindrical region 4 is carried out by forming in the group III nitride semiconductor single crystal 2 a cylindrical cavity having a central axis which is similar to a central axis of the group III nitride semiconductor single crystal 2. The cavity is preferably formed in a region which passes through a border of the facet plane 4p and the plane 3p or inside of the facet plane 4p so as not to remain a region having high impurity concentration which causes the strain.

As in the case of removing the hollow cylindrical region 4 from the group III nitride semiconductor single crystal 2 in the first embodiment, the forming of the cavity is needed to be carried out such that a shape of the group III nitride semiconductor single crystal 2 always keeps an axial symmetry that the central axis of the group III nitride semiconductor single crystal 2 is defined as the symmetrical axis so as not to break the balance of the strain in the group III nitride semiconductor single crystal 2 as removing the hollow cylindrical region 4 from the solid columnar region 3. In this case, the forming of the cavity is progressed in the direction of linear to the growth direction of the group III nitride semiconductor single crystal 2 (the vertical direction to the principal plane 1p in the substrate 1).

For example, when forming the cavity by drilling using a hole saw, grinding using a hollow cylindrical grindstone, an ultrasonic processing using a hollow cylindrical tool, an electric discharge processing using a hollow cylindrical sinker electric discharge electrode, or laser processing, which are described later, it is more preferable to form the cavity such that the shape of the cavity is always kept into the hollow cylindrical shape with a uniform height.

A specific example of the method of separating the hollow cylindrical region 4 will be described below.

Figure 8A:
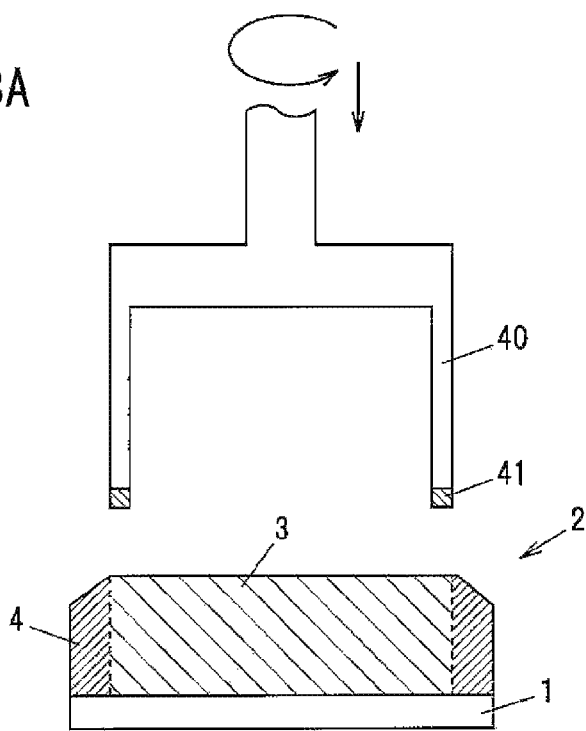
FIG. 8A is a vertical cross sectional view showing schematically a step for forming a cavity by using a hole saw and separating a hollow cylindrical region from a solid columnar region.
Figure 8B:
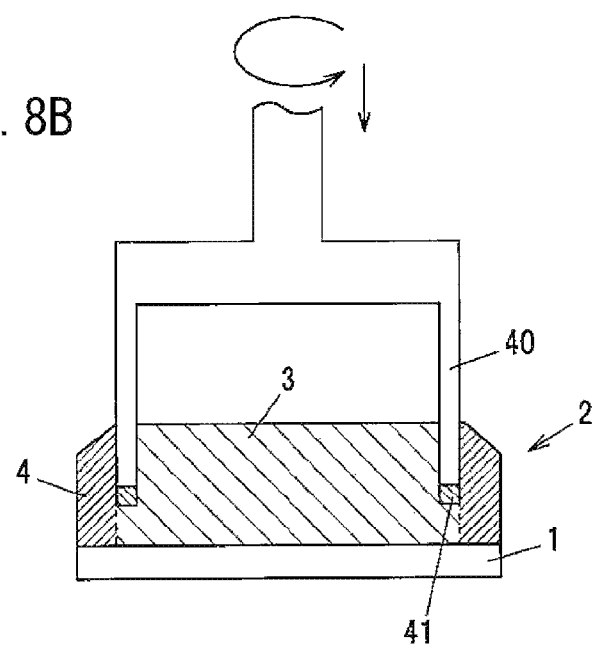
FIG. 8B is a vertical cross sectional view showing schematically a step for forming a cavity by using a hole saw and separating a hollow cylindrical region from a solid columnar region.

FIGS. 8A and 8B are vertical cross sectional views showing schematically the step for forming a cavity by using a hole saw 40 and separating the hollow cylindrical region 4 from the solid columnar region 3.

The hole saw 40 has a blade 41 on an edge (bottom) thereof. As the hole saw 40 is rotated adjusting its rotational axis with the central axis of the group III nitride semiconductor single crystal 2, the cavity is formed slowly while contacting the hole saw 40 with the group III nitride semiconductor single crystal 2. According to the method, the cavity can be formed such that the shape of the cavity is always kept into the hollow cylindrical shape with a uniform height.

Figure 9:
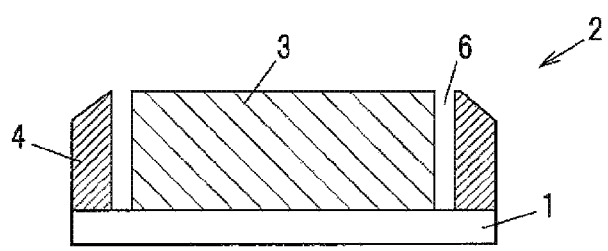
FIG. 9 is a vertical cross sectional view showing a situation of a group III nitride semiconductor single crystal after being separated from the solid columnar region while remaining the hollow cylindrical region on the substrate.

FIG. 9 is a vertical cross sectional view showing a situation of the group III nitride semiconductor single crystal 2 after separating the hollow cylindrical region 4 from the solid columnar region 3. The hollow cylindrical region 4 is separated from the solid columnar region 3 through the cavity 6.

The cavity 6 can be formed by, other than using the hole saw 40, for example, grinding using a hollow cylindrical grindstone whose thickness is close to the hole saw 40, ultrasonic processing using a hollow cylindrical tool whose thickness is close to the hole saw 40, electric discharge processing using a hollow cylindrical electric discharge electrode whose thickness is close to the hole saw 40, or laser processing.

After separating the hollow cylindrical region 4 from the solid columnar region 3, the solid columnar region 3 is sliced after removing the hollow cylindrical region 4 from the substrate 1. Also, the solid columnar region 3 can be sliced with the hollow cylindrical region 4 while remaining the hollow cylindrical region 4 surrounding the solid columnar region 3. In this case, although the hollow cylindrical region 4 is broken, the solid columnar region 3 should not be broken.

Also, when reusing the substrate 1 as the seed crystal, as shown in FIGS. 8A, 8B, and FIG. 9, the cavity 6 is formed from the side of the group III nitride semiconductor single crystal 2 so as to remain a region on the substrate 1 just below the cavity 6 without removing. Then, after forming the semiconductor substrate by slicing the solid columnar region 3 in the group III nitride semiconductor single crystal 2, the principal plane 1p is polished and the substrate 1 is reused as the seed crystal.

(Functions and Advantageous Effects of the Embodiment)

According to the first and second embodiments described above, the strain in the group III nitride semiconductor single crystal epitaxially grown can be removed while preventing the occurrence of the crack, whereby the semiconductor substrate can be obtained by slicing the group III nitride semiconductor single crystal without forming the crack.

Also, as the slicing is carried out after removing the strain in the group III nitride semiconductor single crystal, the strain remaining in the obtained semiconductor substrate can be reduced drastically and a warp of the semiconductor substrate can be reduced. Also, as the warp is reduced, the dispersion of the crystal orientation of the surface of the semiconductor substrate is reduced, and the characteristics dispersion of the device manufactured by the semiconductor substrate can be reduced. Also as the strain remaining in the semiconductor substrate is reduced, when manufacturing the device using the semiconductor substrate, the occurrence of any defect such as break or lack in the semiconductor device can be prevented.

Besides, the first and second embodiments are especially effective in manufacturing the group III nitride single crystal substrate, especially the GaN substrate whose principal plane is the c-plane. As a region whose growth interface is the c-plane in which an arrangement of atoms is dense is hard to incorporate the impurity atoms as compared with a region whose growth interface is the other plane. This is because, in the c-plane grown GaN crystal, the difference of impurity concentration between the region in the outer peripheral edge side that the facet plane is likely to appear and the inner region thereof tends to increase, so that a large strain is likely to accumulate.

Also, the crystal is likely to break according as the caliber increases, the defect density lowers or the crystalline property becomes uniform. This is because there is less defect region such as a dislocation or inversion domain, which has a property of absorbing or relaxing the strain. Thus, the first and second embodiments are especially effective in manufacturing the semiconductor substrate which has a large diameter (for example, a diameter more than 50 mm), less pit or inversion domain, and a low dislocation density (for example, less than $10^7$ cm$^{-2}$).

Although the first embodiment, as the specific example is explained about the GaN crystal with c-plane growth, if there is a difference between the impurity concentrations in the outer peripheral edge side region and in the inner region thereof in the GaN crystal, it is also effective in the case that the GaN crystal is grown in the different direction than the c-plane. Also, a crystal other than the GaN crystal, such as AlN, AlGaN, InGaN, AlInGaN or a crystal having a laminated structure thereof may be used for manufacturing the semiconductor substrate. Also, the growth orientation of the group III nitride semiconductor single crystal may have an off angle.

EXAMPLES

Examples of semiconductor substrates manufactured based on the embodiments will be described below as well as evaluations thereof.

In the present Examples, as the group III nitride semiconductor single crystal 2 in the embodiment described above, the GaN crystal is epitaxially grown using the HVPE method. First, a step for growing the GaN crystal using the HVPE method will be explained.

Figure 10:
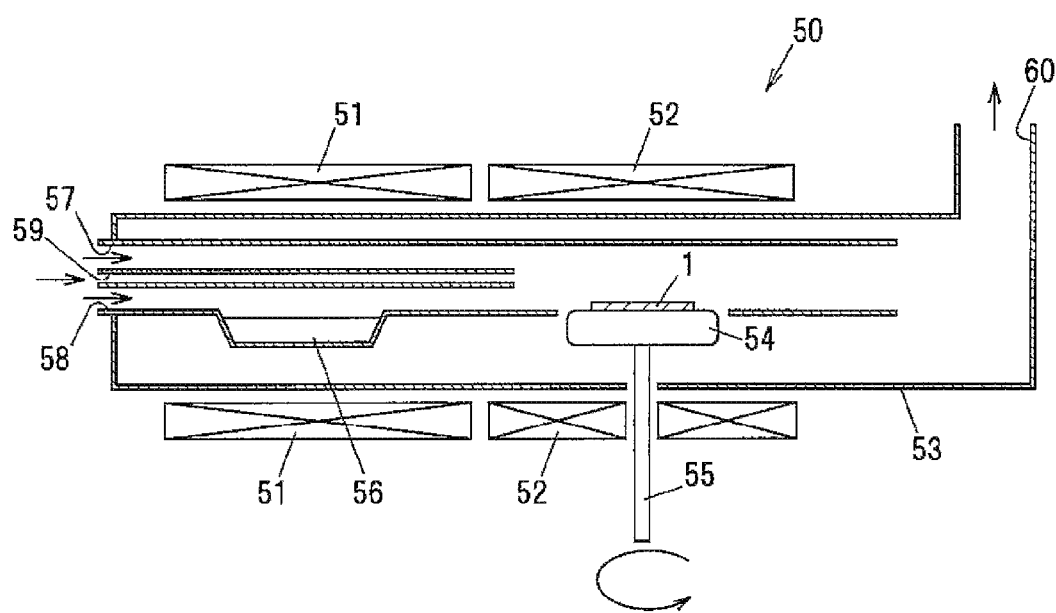
FIG. 10 is a vertical cross sectional view showing schematically a configuration of an HVPE growing machine used for crystal growth of a GaN crystal.

FIG. 10 is a vertical cross sectional view showing schematically a configuration of an HVPE growing machine using for crystal growth of the GaN crystal. The HVPE growing machine 50 comprises a heater that has two zones of a raw material heater 51 heating to about 800° C. in the crystal growth and a crystal growth region heater 52 heating to about 1000° C., and a reaction tube 53 made of quartz interposed in the heater.

An introducing pipe for material gas is arranged at an upstream side of the quartz reaction tube 53. Ammonia gas which is a source of group V material is introduced into a furnace through an ammonia gas introducing pipe 57. Metallic gallium 56 which is a source of group III material is detained in a quartz boat, and mounted in a region where the gallium material heating heater 51. As the crystal grows, hydrochloric acid gas is flown into the boat through a quartz hydrochloric acid gas introducing pipe 58. Then gallium chloride gas is generated by the reaction of the metallic gallium 56 and the hydrochloric acid gas, and is sent to the surface of the substrate 1 through a pipe. The gallium chloride and the ammonia reaction on the surface of the substrate 1 heated, and the GaN crystal is grown. For the inside of the furnace, doping gas can be flown through a doping gas introducing pipe 59. The substrate 1 which becomes the base of crystal growing is fixed by a substrate folder 54 supported by a rotational axis 55, and is rotated during the crystal growth. Gas introduced into the reaction pipe is led to detoxicating equipment through a downstream exhaust pipe 80. Then the gas is exhausted to atmosphere after the detoxification.

Example 1

A GaN crystal is grown on a GaN substrate as the substrate 1 which is made by the VAS method, and has a c-plane as the principal plane and a diameter of 62 mm, by using the HVPE growing machine 50. The conditions of gas flow rate in the HVPE growth are 900 sccm for hydrogen gas as career gas, 8100 sccm for nitrogen gas, gas 180 sccm for gallium chloride, 500 sccm for ammonium gas. Growth pressure is 100 kPa, a substrate temperature during the growth is 1070° C., and growth time is 15 hours. The substrate 1 is rotated by 5 rpm during the growth, and is doped with silicon by about $10^{18}$ cm$^{-3}$ by supplying dichlorosilane as a doping material gas toward a substrate region. Consequently, a silicon doped GaN crystal with a thickness of about 4.5 mm is grown on the substrate 1.

When a fluorescence image is observed by irradiating ultraviolet rays from a mercury lamp toward a surface of thus obtained GaN crystal, a dark ring region with a width of about 3 mm is observed at an outer peripheral edge of the crystal. Also, when the crystal is measured by photo elasticity, a region is observed which has high strain at the outer peripheral edge of the crystal corresponding to the dark region observed by the fluorescence image.

Next, using the hollow cylindrical grindstone 10 shown in FIGS. 3A, 3B, the hollow cylindrical region 4 in the GaN crystal is ground slowly, and the solid columnar region 3 with a diameter of 56 mm is thus left. Next, by slicing the solid columnar region 3 of the GaN crystal using the wire saw, five GaN free-standing substrates with a thickness of 630 μm are obtained. Then, the outer peripheral edge of the obtained GaN free-standing substrates is beveled and formed such that they have a diameter of 50.8 mm. After forming an orientation flat and an index flat on the substrate, the front and rear surfaces of the substrate are mirror polished such that the thickness of the substrates is 400 to 450 μm.

During the above processing, any defect such as crack or chipping is not caused in the GaN crystal. Also, the warps (BOW) of the substrates are all within 10 μm. When a dislocation density of one of the obtained GaN free-standing substrate is counted using the cathode luminescence method, $6.2 \times 10^5$ cm$^{-2}$ in averages in the plane is obtained. When a dispersion in inclination of the c-plane in the surface of the substrate is measured using the X-ray diffraction method, it falls within ±0.05° in the plane for all of the substrates.

Comparative Example

When the GaN crystal grown by the similar method to Example 1 is sliced without removing the hollow cylindrical region 4 by using wire saw, the GaN crystal is broken into two with the crack occurred upon making a cut by wire. Thus, the test process cannot be continued.

Example 2

An undoped GaN layer is grown by 400 nm on a single crystal sapphire substrate which has a c-plane as the principal plane and a diameter of 58 mm, by using the MOCVD method where tri-methyl-gallium and ammonia are used as source materials. Then a titanium metal film is deposited by 20 nm thereon. This substrate as the substrate 1 is put in the HVPE growing machine 50. By thermally treating it in flow of ammonia gas mixed with 20% hydrogen gas at 1050° C. for 30 minutes, the titanium metal film on the surface of the substrate 1 is changed into a mesh-like titanium nitride film and a number of microscopic voids are simultaneously generated on the GaN layer. Next, a silicon doped GaN crystal is grown by 7 mm in thickness by using dichlorosilane as dopant while supplying ammonia and gallium chloride onto the substrate 1 in the HVPE growing machine 50. In the crystal growth, hydrogen and nitrogen mixed gas is used as career gas and the GaN crystal is embedded in the void of the substrate 1 by optimizing the composition ratio of the gas is adjusted so as not to peel off the GaN crystal from the substrate 1 during the growth.

According to the fluorescence image obtained by irradiating ultraviolet rays from a mercury lamp toward a surface of thus obtained GaN crystal, a dark ring region with a width of about 3 mm is observed at an outer peripheral edge of the crystal.

Next, the GaN crystal is separated into the solid columnar region 3 with a diameter of 52 mm and the hollow cylindrical region 4 using a cylindrical grinding stone whose shape is close to the hole saw 8 shown in FIG. 8A, 8B. Next, by slicing the solid columnar region 3 of the GaN crystal using the wire saw, eight GaN free-standing substrates with a thickness of 650 μm are obtained. Then, by beveling the outer peripheral edge of the obtained GaN free-standing substrates, the GaN free-standing substrates are formed such that they have a diameter of 50.0 mm. After forming the orientation flat and index flat on the substrate, the front and rear surfaces of the substrate are mirror polished such that the thickness of the substrates is 400 to 450 μm. During the processing described above, any defect such as crack or chipping is not caused in the GaN crystal.

Example 3

A GaN off substrate which the principal plane inclined at 2° from the c-plane forward the m-axis defines the substrate 1, a GaN crystal having inclined crystal orientation is grown as with the method according to the Example 1. Next, the obtained GaN crystal is separated into the solid columnar region 3 with a diameter of 56 mm and the hollow cylindrical region 4 by ultrasonic processing using the ultrasonic machine. The ultrasonic processing is carried out slowly with supplying diamond slurry using a hollow cylindrical cutter whose shape is close to the hole saw 8 shown in FIG. 8A, 8B. Next, by slicing the solid columnar region 3 of the GaN crystal using the wire saw, five GaN free-standing substrates with a thickness of 630 μm are obtained. Then, by beveling the outer peripheral edge of the obtained GaN free-standing substrates, the GaN free-standing substrates are formed such that they are 50.8 mm in diameter. After forming the orientation flat and index flat on the substrate, the front and rear surfaces of the substrate are mirror polished such that the thickness of the substrate is 400 to 450 μm.

During the above processing, any defect such as crack or chipping is not caused in the GaN crystal. Also, when a c-plane off angle and a dispersion of the c-plane off angle in the plane of the obtained GaN free-standing substrates are measured using X-ray diffraction method, they fall within 2±0.05° in the plane for all of the substrates.

Example 4

By the similar method to Example 1, using as the substrate 1 the GaN substrate which is made by the VAS method, whose principal plane is the c-plane and whose diameter is 62 mm, the silicone doped GaN crystal is grown about 3 mm thick thereon using the HVPE method.

Next, the hollow cylindrical region 4 of the obtained GaN crystal is removed slowly by the laser processing using the laser processor such that the solid columnar region 3 with a diameter of 55 mm remains. The laser processing is carried out in single mode with a wave length of 532 nm, and at a maximum power of 5 w. The hollow cylindrical region 4 is removed by irradiating the laser on the surface of the GaN substrate and rotating it many times at a speed of 10 mm/sec.

Next, by slicing the solid columnar region 3 of the GaN crystal using the wire electric discharge processor, three GaN free-standing substrates with a thickness of 680 μm are obtained. Then, by beveling the outer peripheral edge of the obtained GaN free-standing substrates, the GaN free-standing substrates are formed such that they have a diameter of 50.0 mm. After forming the orientation flat and index flat on the substrate, the front and rear surfaces of the substrate are mirror polished such that the thickness of the substrates is 400 to 450 μm. During the above processing, any defect such as crack or chipping is not caused in the GaN crystal.

Example 5

By the similar method to Example 1, using as the substrate 1 the GaN substrate which is made by the VAS method, whose principal plane is the c-plane and whose diameter is 62 mm, the silicone doped GaN crystal is grown about 4 mm thick thereon using the HVPE method.

Next, using the hollow cylindrical sinker electric discharge electrode 20 shown in FIGS. 4A, 4B, the hollow cylindrical region 4 in the GaN crystal is removed slowly such that the solid columnar region 3 with a diameter of 56 mm remains. Then, by slicing the solid columnar region 3 of the GaN crystal using the wire electric discharge processor, five GaN free-standing substrates with a thickness of 630 μm are obtained. Then, by beveling the outer peripheral edge of the obtained GaN free-standing substrates, the GaN free-standing substrates are formed such that they have a diameter of 50.8 mm. After forming the orientation flat and index flat on the substrate, the front and rear surfaces of the substrate are mirror polished such that the thickness of the substrates is 400 to 450 μm. During the above processing, any defect such as crack or chipping is not caused in the GaN crystal.

Example 6

By the similar method to Example 1, using as the substrate 1 the GaN substrate which is made by the VAS method, whose principal plane is the c-plane and whose diameter is 62 mm, the silicone doped GaN crystal is grown about 3 mm thick thereon using the HVPE method.

Next, the protection film 30 shown in FIG. 6 is formed on the front surface of the obtained GaN crystal and the rear surface of the substrate 1. The protection film 30 is a film which is made of SiO$_2$, and whose diameter is 58 mm. After forming the protection film 30, the GaN crystal covered with the protection film 30 is soaked in the mixed liquid including phosphate and sulfuric acid that is heated by 230° C. in 12 hours. Thereby, the hollow cylindrical region 4 with the front surface and rear surface not covered by the protection film 30 is removed by etching from the side of the rear surface (N-surface). After etching the GaN crystal, the protection film 30 is removed by soaking the GaN crystal in a dilute hydrofluoric acid. Thus, the solid columnar region 3 with a diameter of 56 mm is obtained (the diameter of the solid columnar region 3 reduced by a size smaller than the diameter of the protection film 3).

Next, by slicing the solid columnar region 3 of the GaN crystal using the wire saw, three GaN free-standing substrates with a thickness of 630 μm are obtained. Then, by beveling the outer peripheral edge of the obtained GaN free-standing substrates, the GaN free-standing substrates are formed such that they have a diameter of 50.8 mm. After forming the orientation flat and index flat on the substrate, the front and rear surfaces of the substrate are mirror polished such that the thickness of the substrate is 400 to 450 μm.

Example 7

By the similar method to Example 1, using as the substrate 1 the GaN substrate which is made by the VAS method, whose principal plane is the c-plane and whose diameter is 62 mm, the silicone doped GaN crystal is grown about 4 mm thick thereon using the HVPE method.

Next, using the sinker electric discharge electrode 20 having cylindrical shape shown in FIGS. 4A, 4B, the hollow cylindrical region 4 in the GaN crystal is removed slowly such that the solid columnar region 3 with a diameter of 56 mm remains. Here, the substrate 1 is not processed by the electric discharging processor, as in the substrate 1 shown in FIG. 5, the region just below the hollow cylindrical region 4 is left.

Next, by slicing the solid columnar region 3 of the GaN crystal using the wire electric discharge processor, five GaN free-standing substrates with a thickness of 630 μm are obtained. Then, by beveling the outer peripheral edge of the obtained GaN free-standing substrates, the GaN free-standing substrates are formed such that they have a diameter of 50.8 mm. After forming the orientation flat and index flat on the substrate, the front and rear surfaces of the substrate are mirror polished such that the thickness of the substrates is 400 to 450 μm. During the above processing, any defect such as crack or chipping is not caused in the GaN crystal.

Then, after the GaN free-standing substrates are obtained, the substrate 1 left is reused as the seeding crystal by planarizing the surface thereof using a grinding machine and mirror polishing it. The same manufacturing method of the GaN free-standing substrate as described above is conducted using the reused substrate 1. As a result, obtained is the GaN free-standing substrate whose quality is equivalent to that of the original substrate 1. Thereby, it is confirmed that the GaN substrate can be repeatedly used as the substrate 1.

Although the embodiments and the Examples have been described, the invention is not to be limited to the embodiments and the Examples. The various kind of modifications can be implemented without departing from the gist of the invention.

Also, the invention is not to be limited to the embodiments and the Examples. Further, it should be noted that all combinations of the features described in the embodiments and the Examples are not necessary to solve the problems of the invention.

INDUSTRIAL APPLICABILITY

A method for manufacturing a semiconductor substrate can be provided that allows the manufacture of the semiconductor substrate by slicing the epitaxial grown group III nitride semiconductor single crystal while preventing growing the crack.

REFERENCE SIGNS LIST

1: SUBSTRATE
1p: PRINCIPAL PLANE
2: GROUP III NITRIDE SEMICONDUCTOR SINGLE CRYSTAL
3: SOLID COLUMNAR REGION
3p: PLANE
4: HOLLOW CYLINDRICAL REGION

4p: FACET PLANE
5: SEMICONDUCTOR SUBSTRATE
6: CAVITY
10: GRINDSTONE
20: SINKER ELECTRIC DISCHARGE ELECTRODES
30: PROTECTION FILM
40: HOLE SAW
50: HVPE GROWING MACHINE

What is claimed is:

1. A method for manufacturing a semiconductor substrate, comprising:
epitaxially growing a columnar group III nitride semiconductor single crystal on a principal plane of a circular substrate;
removing a hollow cylindrical region at an outer peripheral edge side of the group III nitride semiconductor single crystal to leave a solid columnar region at an inside of the hollow cylindrical region of the group III nitride semiconductor single crystal; and
slicing the solid columnar region after removing the hollow cylindrical region,
wherein the removing of the hollow cylindrical region is carried out such that a shape of the group III nitride semiconductor single crystal always keeps an axial symmetry that a central axis of the semiconductor crystal is defined as a symmetry axis so as not to break a balance of a strain in the group III nitride semiconductor single crystal.

2. The method according to claim 1, wherein the hollow cylindrical region comprises a region that has a concentration of an impurity that is different from that in the solid columnar region.

3. The method according to claim 1, wherein the hollow cylindrical region comprises a region formed by a crystal growth using a plane that has a different orientation from an orientation in an upper surface of the solid columnar region as a growth interface in the epitaxial growth of the group III nitride semiconductor single crystal.

4. The method according to claim 1, wherein the hollow cylindrical region comprises a facet plane having a plane orientation different from that in the upper surface of the hollow cylindrical region.

5. The method according to claim 1, wherein the removing of the hollow cylindrical region is carried out such that a shape of the removed region is always kept into a hollow cylindrical shape with a uniform height.

6. The method according to claim 1, wherein the removing of the hollow cylindrical region is carried out by grinding using a grindstone, ultrasonic processing, electric discharge processing, etching, or laser processing.

7. The method according to claim 1, wherein the group III nitride semiconductor single crystal is a gallium nitride crystal.

8. The method according to claim 1, wherein an upper surface of the solid columnar region is a c-plane of the group III nitride semiconductor single crystal.

9. The method according to claim 2, wherein the group III nitride semiconductor single crystal is a gallium nitride crystal epitaxially grown by HVPE method, and the impurity is oxygen.

10. The method according to claim 1, wherein the removing of the hollow cylindrical region is carried out such that a region of the substrate just below the hollow cylindrical region is not removed.

11. The method according to claim 10, wherein the principal plane of the substrate is ground after slicing the solid columnar region such that the substrate is reused as a seed crystal.

12. A method for manufacturing a semiconductor substrate, comprising:
epitaxially growing a columnar group III nitride semiconductor single crystal on a principal plane of a circular substrate;
forming a cylindrical cavity in the group III nitride semiconductor single crystal to separate the group III nitride semiconductor single crystal into a hollow cylindrical region at an outer peripheral edge side of the group III nitride semiconductor single crystal and a solid columnar region at an inside of the hollow cylindrical region of the group III nitride semiconductor single crystal; and
slicing the solid columnar region after separating the group III nitride semiconductor single crystal into the hollow cylindrical region and the solid columnar region,
wherein the forming of the cavity is carried out such that a shape of the group III nitride semiconductor single crystal always keeps an axial symmetry that a central axis of the semiconductor crystal is defined as a symmetry axis.

13. The method according to claim 12, wherein the hollow cylindrical region comprises a region that has a concentration of an impurity that is different from that in the solid columnar region.

14. The method according to claim 12, wherein the hollow cylindrical region comprises a region formed by a crystal growth using a plane that has a different orientation from an orientation in an upper surface of the solid columnar region as a growth interface in the epitaxial growth of the group III nitride semiconductor single crystal.

15. The method according to claim 12, wherein the hollow cylindrical region comprises a facet plane having a plane orientation different from that in the upper surface of the hollow cylindrical region.

16. The method according to claim 12, wherein the removing of the hollow cylindrical region is carried out such that a shape of the removed region is always kept into a hollow cylindrical shape with a uniform height.

17. The method according to claim 12, wherein the removing of the hollow cylindrical region is carried out by drilling using a hole saw, grinding using a grindstone, ultrasonic processing, electric discharge processing, or laser processing.

18. The method according to claim 12, wherein the group III nitride semiconductor single crystal is a gallium nitride crystal.

19. The method according to claim 12, wherein an upper surface of the solid columnar region is a c-plane of the group III nitride semiconductor single crystal.

20. The method according to claim 13, wherein the group III nitride semiconductor single crystal is a gallium nitride crystal epitaxially grown by HVPE method, and the impurity is oxygen.

21. The method according to claim 12, wherein the hollow cylindrical region is removed before slicing the solid columnar region.

22. The method according to claim 12, wherein the solid columnar region is sliced along with the hollow cylindrical region while the hollow cylindrical region remains around the solid columnar region.

23. The method according to claim 12, wherein the forming of the cavity is carried out such that a region of the substrate just below the hollow cylindrical region is not removed.

24. The method according to claim 23, wherein the principal plane of the substrate is ground after slicing the solid columnar region such that the substrate is reused as a seed crystal.

* * * * *